United States Patent [19]
Straemke

[11] Patent Number: 5,992,346
[45] Date of Patent: Nov. 30, 1999

[54] APPARATUS FOR THE SURFACE TREATMENT OF WORKPIECES

[76] Inventor: Siegfried Straemke, Fichtenhain 6, 52538, Selfkant, Germany

[21] Appl. No.: 08/778,569

[22] Filed: Jan. 3, 1997

[30] Foreign Application Priority Data

Jan. 17, 1996 [DE] Germany ............... 196 01 436

[51] Int. Cl.⁶ ............... C23C 16/00; H05H 1/00
[52] U.S. Cl. ............... 118/723 E; 118/724; 55/186
[58] Field of Search ............... 118/723 R, 723 E, 118/724; 55/186

[56] References Cited

U.S. PATENT DOCUMENTS

| | | | |
|---|---|---|---|
| 4,361,472 | 11/1982 | Morrison, Jr. . | |
| 4,735,633 | 4/1988 | Chiu ............... | 55/2 |
| 4,971,667 | 11/1990 | Yamazaki et al. ............... | 156/345 |
| 5,072,693 | 12/1991 | Straemke . | |
| 5,211,729 | 5/1993 | Sherman ............... | 55/186 |
| 5,261,963 | 11/1993 | Basta et al. ............... | 118/724 |
| 5,303,558 | 4/1994 | Caton et al. ............... | 62/55.5 |

FOREIGN PATENT DOCUMENTS 4228499  9/1992  Germany .

*Primary Examiner*—Thi Dang
*Attorney, Agent, or Firm*—Diller, Ramik & Wight, PC

[57] ABSTRACT

The invention relates to an apparatus (10) for the surface treatment of workpieces. For providing an apparatus (10) which is suited to perform the plasma treatment of porous workpieces by use of simple means and with continuously high quality, it is provided according to the invention that the workpieces, while arranged in a vaccum container, are subjected first to a cleaning process for evaporating and sucking the adhering foreign substances and subsequently to a plasma treatment process. The apparatus (10) is characterized in that a separator (16) is arranged in the suction pipe (14) between the vacuum container (12) and the vacuum source (18) for separating foreign substances from the gas mixture sucked from the vacuum container (12).

17 Claims, 1 Drawing Sheet

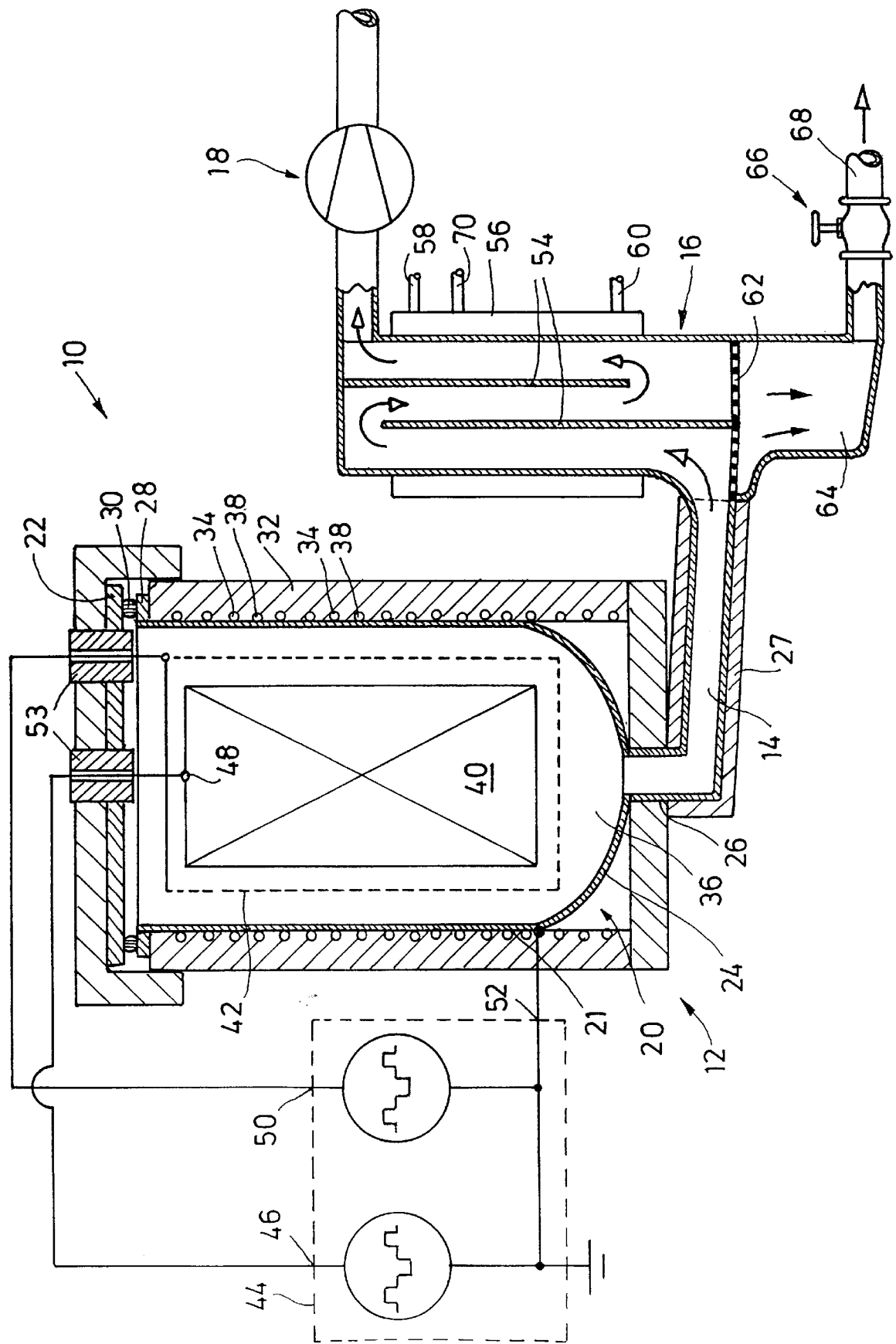

5,992,346

APPARATUS FOR THE SURFACE TREATMENT OF WORKPIECES

FIELD OF THE INVENTION

The invention relates to an apparatus for the surface treatment of workpieces, particularly of porous workpieces.

BACKGROUND OF THE INVENTION

Among all known surface treatment methods, it is particularly plasma treatment methods, e.g. PVD methods and CVD methods, and particularly plasma-nitrogenation and plasma carbon deposition, which find increased use as modern hardening and coating methods.

For performing a plasma treatment method with good treatment results, it is required that the treatment process be carried out in a defined gas atmosphere. The gas atmosphere used for this purpose is diluted and has a pressure in the range of a high vacuum.

Therefore, known apparatus for plasma treatment comprise a vacuum container designed for receiving the workpieces and connected to a vacuum source for generating a vacuum in the vacuum container.

Basically, known apparatus of the above type can be used also for plasma treatment of porous workpieces. However, it may occur that foreign substances, especially liquid and solid hydrocarbons, become clogged in the pores and cavities of porous workpieces. Contaminated surfaces and pores, in turn, will release gases into the vacuum atmosphere and thus will disturb the atmosphere that has been set. Contaminations which are not volatile, e.g. burn-off residues, cause the additional disadvantage that they passivate the workpiece surface and thus render the subsequent plasma treatment difficult or impossible. Therefore, for subjecting porous workpieces to a plasma treatment in a vacuum container, the workpieces must first undergo a pretreatment wherein foreign substances are removed from the pores and cavities of the porous workpieces.

In a known pretreatment process, the hydrocarbons are first burned off in a defined gas atmosphere in a burn-off furnace and, subsequently, a mechanical removal process is carried out, e.g. by subjecting the surface to an abrasive stream.

As an alternative to a pretreatment in a specially dedicated apparatus, it is known from German Patent specification 42 28 499 C1 to perform both the pretreatment processes and the subsequent coating of the workpiece in a vacuum container. For pretreatment, the workpiece is e.g. cleaned and heated by a low-voltage arc discharge. Thereafter, the workpiece is coated by a vacuum-arc discharge between a target and an anodic electrode. The apparatus used for this purpose further comprises an evacuating connection. Since the evaporated particles have to be removed from the vacuum container via the evacuating connection, e.g. a vacuum pump, a danger exists that the pump is damaged. Damage can be caused to the pump particularly when a large quantity of disturbing foreign substances have to be sucked, or when a high vacuum has to be generated, since a pump designed for this purpose is particularly sensitive.

Further, from U.S. Pat. No. 4,361,472, a sputtering device is known for sputtering an element by use of a plasma source. This device comprises a collector face whereon the sputtered material is collected, e.g. by subjecting the collector face to an anode potential. To be able to use such a collector face in a device for cleaning and subsequent coating of a workpiece, the collector face would have to be arranged as closely as possible to the workpiece so as to prevent the intrusion of foreign substances into the vacuum pump operated during the cleaning process. If, however, a workpiece has to be cleaned on all sides, the use of respective collector faces cannot reliably prevent that foreign substances reach the pump and damage it.

The precleaning of workpieces is of eminent importance for the subsequent plasma treatment. However, due to the complex preparation of the workpiece and the apparatus required therefore, plasma treatment of porous workpieces is presently performed only in exceptional cases.

It is an object of the invention to provide an apparatus which is suited to perform the plasma treatment of porous workpieces by use of simple means and with continuously high quality.

SUMMARY OF THE INVENTION

The apparatus for the surface treatment of porous workpieces provided by the invention is distinguished in that the suction pipe between the vacuum container and the vacuum source has a separator arranged therein for separating foreign substances from the gas mixture sucked out of the vacuum container. Said separator makes it possible to perform a cleaning process effective for suctional removal of large quantities of disturbing foreign substances without damaging the vacuum source designed to generate a high vacuum. Since the foreign substances removed from the workpieces are separated in the separator, the gas flow generated by the vacuum source can be provided with little expenditure and be recirculated or supplied to a controlled disposal means.

Thus, in the inventive apparatus, the porous workpieces arranged in the vacuum container can be successively subjected first to a cleaning process for evaporating and sucking the adhering foreign substances and subsequently to a plasma treatment process without the need to transfer the workpieces from a cleaning vessel to a special plasma treatment vessel between the cleaning process and the plasma treatment process. Since the cleaning process and the plasma treatment process are successiveley performed in the same vacuum container, a workpiece surface which has been cleaned in the cleaning process will not be negatively influenced by environmental factors before the plasma treatment, so that the danger of passivation and a resultant unsatisfactory result of the plasma treatment is reduced.

Further, the working process is simplified and the structural expenditure is reduced. Additionally, time and energy are saved since workpieces which have been heated for evaporation need not be cooled and then be reheated for the plasma treatment process. The vacuum generated during the suctional removal of foreign substances in the cleaning process can be utilized when generating the atmosphere for the plasma treatment process.

If especially large quantities of foreign substances are expected to occur on a regular basis, the vacuum source can comprise two vacuum pumps, one of them being unsensitive to foreign substances and provided for the cleaning process and the other one being used to build up a high vacuum.

Special problems exist when the porous workpieces are sintered bodies which have been pressed to conform form to predetermined sizes. The surfaces of such sintered bodies normally present large quantitities of oil, grease or wax which have been applied to protect the tools against wear during the production of the sintered bodies.

When using the apparatus for the treatment of workpieces heavily contaminated by hydrocarbons, e.g. by oil, grease or wax, a danger exists that these substances will damage the vacuum source. Therefore, in a preferred embodiment of the apparatus, the separator is preferably a hydrocarbon separator which comprises a condenser provided with a heater unit for cleaning the condenser. The condenser can be used also for the separation of vaporous and gaseous hydrocarbons so that the vacuum source is reliably protected. Using the heater unit, the condenser can be cleaned when its effectiveness has been impaired by hydrocarbon depositions.

The occurrence of large quantities of wax entails the further danger that the suction pipe from the vacuum container to the condenser will be clogged by wax depositions. To preclude the formation of such wax depositions, the suction pipe is preferably inclined from the vacuum container to the condenser and provided with a heater or an insulation means so that no wax can settle on the wall of the suction pipe.

In a preferred embodiment of the apparatus for the surface treatment of porous workpieces, an auxiliary electrode is designed as an electrode array at least partially surrounding the workpiece receiving space. Said electrode array, preferably provided as a lattice enclosing the workpiece receiving space, offers the possibility to selectively generate a plasma between the vessel wall—acting as a counterelectrode—and the auxiliary electrode, or between the auxiliary electrode and the workpieces. Thereby, the cleaning process can be controlled in accordance with its progress.

Further, the auxiliary electrode facilitates the generation of a static electric field for the acceleration of gas ions during the cleaning phase. To generate the electric fields required in the various phases of the surface treatment, a voltage source for voltage supply to the workpieces and the electrodes can be selectively switched between a field generation mode, a pulsed plasma generation mode and an auxiliary mode.

Further advantageous embodiments and modifications of the invention will be apparent from the claims and the detailed description of an especially advantageous embodiment of the apparatus in conjunction with the drawing.

BRIEF DESCRIPTION OF THE DRAWING

The sole FIGURE of the drawing shows a sectional view of the inventive apparatus for the surface treatment.

DESCRIPTION OF A PREFERRED EMBODIMENT

The apparatus 10 for the surface treatment of porous workpieces comprises a vacuum container 12 connected to a vacuum source 18 via a suction pipe 14 and a separator 16.

Vacuum container 12 comprises a vacuum-tight vessel 20 with a container wall 21. A removable cover 22 is provided for closure of vacuum container 12. Vessel 20 at its lower end side comprises a draining trough 24 provided with a centrally arranged drain socket 26 for connection to suction pipe 14. Suction pipe 14 is provided with a thermal insulating means 27. Arranged on the upper end of vessel 20 is a support ring 28 for supporting the cover 22, with an annular sealing 30 being interposed between support ring 28 and cover 22.

Vessel 20 is surrounded on all sides by a thermal insulating shield 32. The interior 36 of vacuum container 12 can be heated by a heating means 34 abutting the wall of container 12 and embedded in insulating shield 32. A cooling means 38, likewise embedded in insulating shield 32, is operative to cool the wall of vacuum container 12.

The interior 36 of vacuum container 12 includes a workpiece receiving region 40 wherein workpieces can be positioned in batches. Workpiece receiving region 40 is surrounded by a wire-lattice cage 42 which is arranged at a distance to container wall 21 and the workpiece receiving region 40 and can be switched for use as an auxiliary electrode.

To generate an electric field or a plasma in vacuum container 12, a voltage source 44 is provided which by a first terminal 46 is connected to a connection means 48 which is connectable to workpieces acting as electrodes. A second terminal 50 of voltage source 44 is connected to wire-lattice cage 42, and a third terminal 52 is electrically connected to container wall 21 which, depending on the respective switching position of voltage source 44, acts as a counterelectrode. The cable passages 53 of the lines extending from the first terminal 46 and the second terminal 50 to the connection means 48 and to the wire-lattice cage 42, respectively, lead through the cover 22 of vacuum container 12. Preferably, the cable passages 53 comprise self-cleaning insulating bodies according to U.S. Pat. No. 5,072,693. Voltage source 44 is preferably set in such a manner that the wall 21 of vacuum vessel 20 is kept on ground potential.

The above described apparatus 10 is adapted to perform a surface treatment in different modes of operation. First, vacuum container 12 is loaded and closed.

Then, the cleaning of the workpieces takes place in a cleaning process provided to be performed prior to the plasma treatment process. For the cleaning process, the workpieces arranged in vacuum container 12 are heated. In this manner, hydrocarbons and other foreign substances attached to the workpieces are evaporated. Foreign substances which have been detached from the workpieces are removed from vacuum container 12 by suction force.

During the cleaning process, the vacuum source 18 is operated to suck a gas flow from interior 36 of vacuum container 12. Said gas flow is guided to pass through separator 16 which includes a plurality of deflector plates 54 having the gas flow change its direction a number of times. For operating the separator 16 as a condenser, separator 16 is cooled down by supplying a coolant via a coolant supply line 58 to a cooling means 56, which coolant will then be discharged via a coolant discharge line 60. Hydrocarbons deposit on the walls of separator 16 and on deflector plates 54 and will then be drained off, via a perforated plate 62, into a condensate drain means 64. To provide for drainage of foreign substances deposited in suction pipe 14, suction pipe 14 is arranged at an inclination towards condensate drain means 64. When a certain quantity of condensate has gathered in condensate drain means 64, a locking slider 66 can be opened, allowing the condensate to be discharged via a condensate pipe 68.

By heating the workpieces to a temperature below the decomposition temperature of hydrocarbon residues, the cleaning process is accelerated without generating decomposition residues which would affect the plasma treatment process.

Workpieces which have undergone such a cleaning process as an initial treatment, can then be immediately subjected to a plasma treatment while the vacuum is maintained or increased.

To enhance the suction of hydrocarbon residues evaporated from the workpieces, a plasma can be ignited between an auxiliary electrode and a counterelectrode so as to convert the hydrocarbon in the plasma. With container wall 21 used as a counterelectrode in this process, such a plasma will also clean the container wall 21.

If particularly clean surfaces are required, the initial treatment can be followed by an intermediate cleaning phase wherein hydrocarbon residues are detached from the workpieces by gas ions accelerated in an electric field. The electric field can be generated by applying a voltage between the workpiece and a counterelectrode, e.g. the wall of the vacuum container or an auxiliary electrode. The accelerating of the gas ions towards the porous workpiece provides for a smooth cleaning of the pores and cavities of the workpiece without the danger of coking depositions.

The gas ions to be used in said intermediate cleaning phase can be generated in a plasma generated between two electrodes arranged at a distance from the workpiece, e.g. between wire-lattice cage 42 and container wall 21. The electric field carrying the gas ions to the workpieces is independent from the plasma treatment and can have low strength. Therefore, the heat-up of the workpieces is low, and the temperature of the workpieces will particularly lie below a temperature which would cause the hydrocarbons to coke.

The cleaning process can also be provided to include an additional final cleaning phase wherein the workpieces are cleaned in a plasma enclosing them. In this plasma cleaning process, which again includes a suction removal process, the workpieces are temporarily switched to act as a cathode. Preferably, the plasma generated for the plasma cleaning is pulsed, thus preventing thermal overload of the workpieces.

To preclude possible encrustations due to hydrocarbon residues, the duty ratio between the switch-on time and the switch-off time of the plasma pulses is adapted to the progress of the process. Preferably, the switch-on time of the pulses is increased relative to the switch-off time of the pulses in accordance to the extent to which the cleaning has advanced, since hydrocarbon residues having a thickness of only a few nanometers do not form tenacious encrustations. Particularly, the progress of the cleaning can be determined by monitoring the decrease of the vacuum in vacuum container 12 caused by the formation of gas from the hydrocarbon residues. The duty ratio between the switch-on time and the switch-off time of the pulses will then preferably be controlled in accordance with the results of this monitoring process. In a cleaning process, a base discharge, permanently maintained in vacuum container 12, effects the ionization and in said final cleaning phase facilitates the repeated ignition of the plasma by use of a pulsed plasma.

In the cleaning phase, the wire-lattice cage 42 is particularly advantageous because it allows for a separate control of the field for generating the plasma and the field for ion transport to the workpieces. Preferably, the voltage between the wirelattice cage 42 and the container wall 21 is high and is pulsed, whereas the voltage between the wire-lattice cage 42 and the workpieces is low and constant. Thereby, a formation of solids during removal of the hydrocarbon residues can be prevented. When hydrocarbon residues have been reduced down to a layer thickness in the nanometer range, a plasma for cleaning the workpieces can be ignited also between the wire-lattice cage 42 and the workpieces.

The cleaning of separator 16 can be performed by actuating a heater unit (not shown) fed by a power source via a connecting line 70. Thereby, hydrocarbons attached to the walls and the deflector plates 54 and solidified thereon will become highly fluid and therefore drip into the condensate drain means 64.

To make it possible, in a plasma treatment process performed by apparatus 10 subsequent to the cleaning phase, to set a desired atmosphere, e.g. a nitrogen atmosphere for nitrogenation, vacuum container 12 is provided with a gas inlet means for supplying reaction and/or inert gases into the interior 36 of vacuum container 12. The illustrated apparatus 10 is suitable both for PVD methods and CVD methods and particularly for plasmanitrogenation and plasma carbon deposition.

To allow a well-aimed control of the plasma treatment process, a measuring unit, kept on the workpiece potential, is provided for detecting the temperature of the workpieces. Since also the temperature of vessel 20 is monitored and, if required, is influenced by heating means 34 or cooling means 38, optimum plasma treatment conditions can be maintained in vacuum container 12 at all times. During the plasma treatment process, the cooling means 38 serves to prevent an overheating of vessel 20.

I claim:

1. An apparatus for the surface treatment of porous workpieces comprising a vacuum container (12) for receiving the workpieces, connection means (48) in the vacuum container (12) for connecting the workpieces as electrodes to a voltage source (44), a vacuum source (18) connected to the vacuum container (12) via a suction pipe (14), a separator (16) in the suction pipe (14) between the vacuum container (12) and the vacuum source (18) for separating foreign substances from the gas mixture sucked from the vacuum container (12), a condensate drain (64) in fluid communication between the separator (16) and an output (68) for discharging condensate, and means (70) for intermittently heating the separator (16) for liquefying any depositions solidified on interior surfaces of the separator (16) whereby liquified depositions can be discharged with the condensate through the condensate drain (64) and the output (68).

2. The apparatus according to claim 1 wherein the separator (16) is a hydrocarbon separator comprising a condenser with a heater unit for cleaning the condenser.

3. The apparatus according to claim 1 wherein the suction pipe (14) is inclined from the vacuum container (12) to the separator (16) and is provided with a heater or an insulation means (27).

4. The apparatus according to claim 1 wherein a heating means (34) and a cooling means (38) are provided for heating and cooling, respectively the container wall (21) of the vacuum container (12).

5. The apparatus according to claim 1 wherein the vacuum container (12) has arranged therein an electrode array, substantially formed as a lattice (42), at least partially surrounding a workpiece receiving space and acting as an auxiliary electrode (42).

6. The apparatus according to claim 1 including means for selectively switching the voltage source (44) between a field generation mode wherein a static field is applied between the workpieces and a counterelectrode, and a pulsed plasma generation mode.

7. The apparatus according to claim 6 including means operative in the plasma generation mode for controlling the ratio between the switch-on time and the switch-off time of the plasma pulses relative to the progress of the treatment process.

8. The apparatus according to claim 7 wherein the controlling means include means for controlling the ratio between the switch-on time and the switch-off time of the pulses dependent upon the formation of gas from residues of foreign substances.

9. The apparatus according to claim 5 wherein the auxiliary electrode (42) is connected to the voltage source (44)

to generate a plasma between the vessel wall (21) and the auxiliary electrode (42).

10. The apparatus according to claim 5 wherein the auxiliary electrode (42) is connected to a container wall (21) of the vacuum container (12) and the workpieces so that the auxiliary electrode (42) and the container wall (21) can be switched to a common potential.

11. The apparatus according to claim 10 including means for reversing the polarity of the workpieces dependent upon the progress of the treatment process.

12. The apparatus according to claim 11 wherein the controlling means includes means for controlling the ratio between the switch-on time and the switch-off time of the polarity reversal dependent upon the formation of gas from residues of foreign substances.

13. The apparatus according to claim 1 wherein electric connecting lines leading into the vacuum container (12) are insulated against the container wall (21) by self-cleaning insulating bodies.

14. The apparatus according to claim 13 wherein the self-cleaning insulating bodies comprise gas channels for providing a gas flow sweeping along lamellae arranged on the insulating bodies.

15. The apparatus according to claim 1 including measuring means kept at workpiece potential for detecting the temperature of the workpieces.

16. The apparatus according to claim 5 wherein the auxiliary electrode (42) is connected to the voltage source (44) to generate a plasma between the workpieces and the auxiliary electrode (42).

17. The apparatus according to claim 5 wherein the auxiliary electrode (42) is connected to a container wall (21) of the vacuum container (12) and the workpieces so that the auxiliary electrode (42) can be switched to a common potential.

* * * * *